(12) United States Patent
Schroder et al.

(10) Patent No.: US 9,631,283 B2
(45) Date of Patent: Apr. 25, 2017

(54) SUBSTRATE FOR PRINTED ELECTRONICS AND PHOTONIC CURING PROCESS

(71) Applicant: SHOWA DENKO K.K., Tokyo (JP)

(72) Inventors: Kurt A. Schroder, Coupland, TX (US); Hiroshi Uchida, Tokyo (JP); Kenji Shinozaki, Tokyo (JP)

(73) Assignees: SHOWA DENKO K.K., Tokyo (JP); NCC NANO, LLD, Austin, TX (US)

( * ) Notice: Subject to any disclaimer, the term of this patent is extended or adjusted under 35 U.S.C. 154(b) by 48 days.

(21) Appl. No.: 14/405,662

(22) PCT Filed: May 31, 2013

(86) PCT No.: PCT/IB2013/001254
§ 371 (c)(1),
(2) Date: Dec. 4, 2014

(87) PCT Pub. No.: WO2013/182896
PCT Pub. Date: Dec. 12, 2013

(65) Prior Publication Data
US 2015/0225857 A1 Aug. 13, 2015

Related U.S. Application Data

(60) Provisional application No. 61/655,644, filed on Jun. 5, 2012.

(51) Int. Cl.
*B32B 3/02* (2006.01)
*C23C 30/00* (2006.01)
(Continued)

(52) U.S. Cl.
CPC .............. *C23C 30/00* (2013.01); *B41M 3/006* (2013.01); *H05K 1/036* (2013.01); *H05K 3/1283* (2013.01);
(Continued)

(58) Field of Classification Search
CPC ...... C32C 30/00; H05K 1/097; H05K 1/0393; H05K 3/1283
See application file for complete search history.

(56) References Cited

U.S. PATENT DOCUMENTS 6,251,507 B1 6/2001 Yamamoto et al.
7,394,663 B2 7/2008 Yamashita et al.
(Continued)

FOREIGN PATENT DOCUMENTS

CN 1543291 A 11/2004
CN 101443483 A 5/2009
JP 2011-000892 A 1/2011

OTHER PUBLICATIONS

Extended European Search Report dated Dec. 17, 2015 from the European Patent Office issued in corresponding Application No. 13799914.0.
(Continued)

*Primary Examiner* — Elizabeth Mulvaney
(74) *Attorney, Agent, or Firm* — Sughrue Mion, PLLC

(57) ABSTRACT

A coating layer 12 is formed on a base film 10 by heat resistant resin having a Tg (glass transition temperature) of 120° C. or more, and more preferably 200° C. or more, and a functional thin film 14 is produced by printing ink composite including conductive particles on a surface of the coating layer 12 and thereby forming an ink layer. This functional thin film 14 is sintered by heating performed by photo irradiation, and a conductive layer is formed thereby.

25 Claims, 4 Drawing Sheets

(51) Int. Cl.
*B41M 3/00* (2006.01)
*H05K 1/03* (2006.01)
*H05K 3/12* (2006.01)
*H05K 1/09* (2006.01)

(52) U.S. Cl.
CPC ......... *H05K 1/0373* (2013.01); *H05K 1/0393* (2013.01); *H05K 1/095* (2013.01); *H05K 2201/0195* (2013.01); *Y10T 428/24942* (2015.01)

(56) References Cited

U.S. PATENT DOCUMENTS

| 8,133,592 | B2 | 3/2012 | Takada et al. |
| 9,095,874 | B2 | 8/2015 | Schroder et al. |
| 2006/0257625 | A1 | 11/2006 | Wakizaka |
| 2008/0020304 | A1 | 1/2008 | Schroder et al. |
| 2009/0047588 | A1 | 2/2009 | Yanus et al. |
| 2010/0059251 | A1 | 3/2010 | Remizov et al. |
| 2010/0189975 | A1 | 7/2010 | Kakuno et al. |

OTHER PUBLICATIONS

International Search Report of PCT/IB2013/001254 dated Nov. 1, 2013 [PCT/ISA/210].
Written Opinion of PCT/IB2013/001254 dated Nov. 1, 2013 [PCT/ISA/237].
First Office Action dated Feb. 3, 2016, issued by the State Intellectual Property Office of the P.R.C. in corresponding Chinese Application No. 201380029777.4.
Notification of Reason for Refusal dated Mar. 2, 2016, issued by the Korean Intellectual Property Office in corresponding Korean Application No. 10-2014-7034282.
The Second Office Action dated Sep. 30, 2016, issued by the State Intellectual Property Office of the People's republic of China in corresponding CN Application No. 201380029777.4.
Notice of Final Rejection dated Sep. 30, 2016, issued by the Korean Intellectual Property Office in corresponding KR Application No. 10-2014-7034282.

SUBSTRATE FOR PRINTED ELECTRONICS AND PHOTONIC CURING PROCESS

CROSS REFERENCE TO RELATED APPLICATIONS

This application is a National Stage of International Application No. PCT/IB2013/001254, filed May 31, 2013, claiming priority based on U.S. Provisional Application No. 61/655,644, filed Jun. 5, 2012, the contents of all of which are incorporated herein by reference in their entirety.

TECHNICAL FIELD

The present invention relates to a substrate film and a sintering method.

BACKGROUND

To form a conductive layer such as a semiconductor, metal and the like on a substrate, for example, the conductive layer may be formed by printing an ink layer on the substrate using an ink composite (conductive ink) in which conductive particles are dispersed, and sintering the conductive particles in the ink layer.

For example, the below described Patent Document 1 discloses a technique that coats an adhering layer by applying an adhesive to a substrate, coats a water repellent layer on the substrate on which the adhering layer is coated, prints conductive ink on the substrate on which the adhering layer and the water repellent layer are coated, and performs sintering of the printed conductive ink and curing of the adhering layer.

Further, the below described Patent Document 2 discloses a device that manufactures an electronic component by scattering metal microparticles on a substrate including an insulating pattern formed by a thermoset resin to adhere the metal microparticles on the insulating pattern, melting the insulating pattern by heating, fixing the metal microparticles on the insulating pattern, and removing the metal microparticles adhered to a surface of the substrate other than the insulating pattern.

In the method of Patent Document 1, a sintering condition is heating for 1 hour at 200° C. (paragraph 0044 of Patent Document 1), and in the method of Patent Document 2, a heating temperature of the insulating pattern is 150 to 200° C. (paragraph 0028 and the like of Patent Document 2), however, generally, upon heating a conductive pattern or an insulating pattern on a substrate, the heating is performed on an entire substrate; thus, the substrate that can be used is limited to those with high heat resistivity, such as substrates made of a thermoset resin with a high thermal resistance, for example, a BT resin including bismaleimide-triazine compounds and the like.

Due to this, as described in Patent Documents 3 to 5, there had been attempts to use an ink composite including nanoparticles, and form a metal pattern from the ink composite by photo irradiation. Methods that use light energy or microwaves in heating can selectively heat only the ink composite (nanoparticles), and there is a possibility that a resin having a lower thermal resistance than the above described resin can be used as the substrate.

CITATION LIST

Patent Document

[Patent Document 1] Japanese Patent Application Laid-Open No. 2010-75911

[Patent Document 2] Japanese Patent Application Laid-Open No. 2005-203396

[Patent Document 3] Japanese Patent Application National Publication No. 2008-522369

[Patent Document 4] WO 2010/110969

[Patent Document 5] Japanese Patent Application National Publication No. 2010-528428

However, in a case of using an ink composite in which silicon particles or nickel oxide particles are for example dispersed, energy of light to be irradiated needs to be increased because energy is required for transition of a crystal structure of the silicon particles or reduction of nickel oxides. Further, also in a case of forming a thick conductive layer by using an ink composite in which copper particles or copper oxide particles are dispersed, the energy of the light to be irradiated needs to be increased because more energy is required than in forming a thin film. Due to this, when a resin with a low thermal resistance such as PET and the like is used for the substrate, there were problems in that wrinkling or melting occurs in the substrate during sintering of the ink composite.

SUMMARY

An objective of the present invention is to provide a substrate film and a sintering method capable of preventing the occurrence of wrinkling, melting and the like in a substrate during photo irradiation.

In order to achieve the above objective, one aspect of the present invention is a substrate film comprising a base film, and a coating layer (heat resistant layer) formed on the base film, wherein the coating layer is formed of a heat resistant resin having a higher Tg than the base film, and has a surface on which a functional thin film is to be sintered by photo irradiation. The heat resistant resin has a Tg (glass transition temperature) of 120° C. or more.

The resin that forms the coating layer can be a crosslinked three-dimensional resin, and the Tg is more preferably higher than 200° C. Thickness of the coating layer may be 0.1 to 10 μm.

Further, the heat resistant resin that forms the coating layer can contain 5 to 80 mass % of at least one filler selected from the group consisting of silica, alumina, titania and zirconia, the filler having 500 nm or less average particle diameter d50 measured by dynamic light scattering.

Further, the base film can be a polyethylene terephthalate film, polyethylene naphthalate film, polycarbonate film, polyacrylate film, polyolefin film, polycycloolefin film, or polyimide film, or paper. Thickness of the base film can be 10 μm to 3 mm.

Further, another aspect of the present invention is a substrate provided with a functional thin layer (pattern) which is sintered by photo irradiation on the coating layer (heat resistant layer) of the above mentioned respective substrate films.

Further, another aspect of the present invention is a sintering method comprising preparing the respective substrate films, forming the functional thin film (pattern) on the surface of the coating layer, and sintering the functional thin film (pattern) by the photo irradiation.

The light to be irradiated can be pulsed light having a wavelength of 200 to 3000 nm.

The functional thin film (pattern) may comprises at least one selected from the group consisting of gold, silver, copper, aluminum, nickel, cobalt, oxides thereof, graphite, graphene, carbon nanotube, zinc oxide, tin oxide, indium tin oxide, and polysilane.

Further, the functional thin film (pattern) can be formed by sputtering targeting silicon, germanium, tin, lead, arsenic, antimony, bismuth, gallium, indium, tallium, zinc, cadmium, selenium, tellurium, and oxides and complex oxides thereof.

DESCRIPTION OF EMBODIMENTS

Hereinbelow, exemplary embodiments (hereinbelow referred to as embodiments) will be explained with reference to the drawings.

Figure 1:
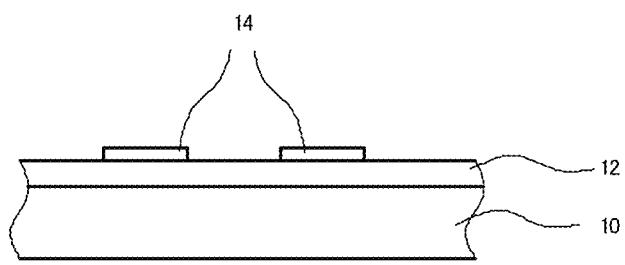
FIG. 1 is a partial cross sectional view of a configurational example of a substrate film of an embodiment.

FIG. 1 shows a partial cross sectional view of a configurational example of a substrate film of an embodiment. In FIG. 1, the substrate film is configured by including a base film 10, and a coating layer 12. Further, in the example of FIG. 1, a functional thin film 14 is formed on a surface of the coating layer 12.

The base film 10 is for example formed of polyethylene terephthalate, polyethylene naphthalate, polycarbonate, polyacrylate, polyolefin, polycycloolefin, polyimide, or paper that is processed in a film shape, however, a material thereof is not limited to these, and any material that can be used as a substrate can be used. Further, thickness of the base film 10 is not limited, and can be 10 μm to 3 mm or more. If the thickness of the base film is too thin, such is not preferable due to a reduction in film strength, whereas on the other hand, although there is no specific limitation to the thickness being thick, a too thick base film cannot be used for cases which require flexibility. Due to this, the thickness of the film is 10 μm to 3 mm, and more preferably 16 μm to 288 μm when the flexibility and easy acquisition are taken into consideration.

Note that, measurements of the above film thickness can for example be performed by a reflection spectroscopic film thickness meter.

The coating layer 12 is suitably formed by a layer having a higher thermal resistance to the base film, for example, a layer formed of a resin having a Tg (glass transition temperature) of 120° C. or more, preferably 140° C. or more, more preferably 170° C. or more, and particularly preferably 200° C. or more. This is because resistance to heat generated upon below-described photo-sintering of the ink composite should be given. As a material configuring the coating layer 12, a crosslinked three-dimensional resin such as a polyfunctional acrylic resin is suitable, however, no limitation is made hereof; and those with a surface onto which printing can be performed by using the ink composite in which conductive particles, semiconductor particles and the like are dispersed, or lamination of metal, metal oxide and the like can be performed by sputtering and the like can be used. Further, triazine thiol can be mixed in the resin configuring the coating layer 12 to improve adhesiveness to the conductor particles and the semiconductor particles. Further, the thermal resistance can be improved by mixing 1 to 80 mass % of silica and/or alumina and/or titania and/or zirconia having 500 nm or less average particle diameter D50 measured by dynamic light scattering in the resin configuring the coating layer 12. Here, if a mixing ratio of the silica and/or alumina and/or titania and/or zirconia is small, an effect of improving the thermal resistance cannot be obtained, and if the mixing ratio is too large, coating becomes difficult. The mixing ratio is preferably 5 to 70 mass %, and more preferably 5 to 50 mass %.

Further, thickness of the coating layer 12 can be 0.1 to 10 μm. The coating layer 12 thinner than 0.1 μm is not preferable because such coating layer cannot function as the heat resistant layer. Whereas on the other hand, if the thickness of the coating layer 12 is thicker than 10 μm, although such can be used, there may be cases in which the coating layer spoils the flexibility of a flexible base film when the coating layer is used in combination with the base film.

The thickness of the coating layer 12 formed on the base film 10 can be measured for example by reflection spectroscopic film thickness meter FE-3000 manufactured by Taiyo Electronics Co., Ltd. by previously obtaining refractive indices of the base film 10 and the coating layer 12. In a case where the refractive indices are unknown, such may be estimated from coating amounts.

By having the configuration of the substrate film of the present embodiment, occurrence of wrinkling, melting and the like in the substrate caused during the irradiation of light can effectively be suppressed in cases of using a base film with a relatively low thermal resistance such as polyethylene-terephthalate, however, this does not exclude uses of polyimide film and the like having a relatively high thermal resistance as the base film 10.

The functional thin film 14 formed on the surface of the coating layer 12 is produced as an ink layer formed by printing the ink composite in which particles of at least one selected from the group consisting of gold, silver, copper, aluminum, nickel, cobalt, oxides thereof, graphite, graphene, carbon nanotube, zinc oxide, tin oxide, indium tin oxide, and polysilane, are dispersed in an appropriate solvent as the conductive particles. Note that, a conductive layer is formed by sintering this functional thin film 14 (ink layer) by the photo irradiation.

As the solvent to disperse the conductive particles, for example, carbonyl compounds such as acetone, methyl ethyl ketone, cyclohexanone, benzaldehyde, octyl aldehyde and the like; ester compounds such as methyl acetate, ethyl acetate, butyl acetate, ethyl lactate, methoxyethyl acetate and the like; carboxylic acids such as formic acid, acetic acid, oxalic acid and the like; ether compounds such as diethyl ether, ethylene glycol dimethyl ether, ethyl cellosolve, butyl cellosolve, phenyl cellosolve, dioxane and the like; aromatic hydrocarbon compounds such as toluene, xylene, naphthalene, decaline and the like; aliphatic hydrocarbon compounds such as pentane, hexane, octane and the like; halogen hydrocarbons such as methylene chloride, chlorobenzene, chloroform and the like; alcohol-based compounds such as methanol, ethanol, n-propanol, isopropanol, butanol, cyclohexanol, terpineol, ethylene glycol, propylene glycol, glycerin and the like; water; and mixed solvents thereof may be exemplified. Among the above solvents, water-soluble solvents are preferable, and especially alcohol and water are preferable. Note that, in a case of using the metal oxides as the conductive particles, it is preferable for the solvent to contain a reducing agent. Although the above mentioned organic solvents have reduction properties, however, in considering reduction efficiency, polyalcohol such as ethylene glycol, propylene glycol, glycerin and the like and carboxylic acids such as formic acid, acetic acid, oxalic acid and the like are suitable.

Further, in order to print the ink composite, a binder resin can be used for a purpose of adjusting viscosity and the like. Polymers that can be used as the binder resin may be thermoplastic resins or thermoset resins such as: poly-N-vinyl compounds such as polyvinyl-pyrrolidone, polyvinyl-caprolactone and the like, polyalkylene glycol compounds such as polyethylene glycol, polypropylene glycol, poly THF and the like, polyurethane, cellulose compounds and derivatives thereof, epoxy compounds, polyester compounds, chlorinated polyolefin, and polyacrylic compounds. These binder resins all have functions as reducing agents although there are differences in degrees of their effects. Among these, polyvinyl-pyrrolidone is preferable in considering the binder effect, polyalkylene glycol such as polyethylene glycol, polypropylene glycol and the like is preferable in considering the reduction effect, and further, polyurethane compounds are preferable from the viewpoint of the adhesiveness of the binder.

A method of printing the ink composite is not particularly limited, however, a wet coating can for example be exemplified. The wet coating refers to a process of producing a film by applying liquid on the coating layer 12. The wet coating used in the present embodiment is not particularly limited so long as it is one of the known methods; and spray coating, bar coating, roll coating, die coating, dip coating, drop coating, ink jet printing, screen printing, relief printing, intaglio printing, planographic printing, gravure printing and the like can be used.

As the light used in the above sintering, continuous light or pulsed light of 200 nm to 3000 nm can be used, and the pulsed light by which heat accumulation upon sintering is more unlikely to occur is more preferable.

Figure 2:
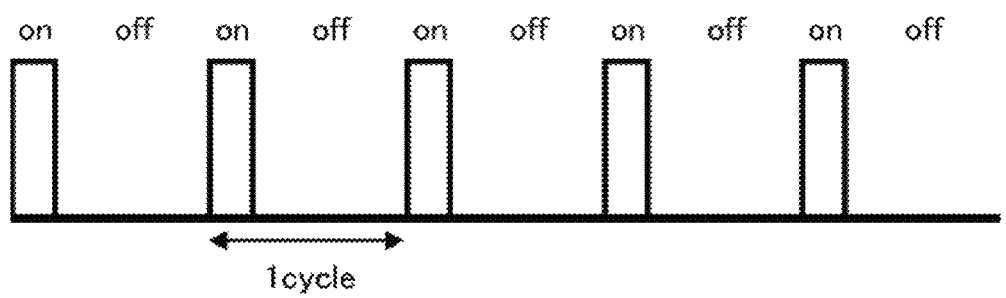
FIG. 2 is a diagram for explaining a definition of pulsed light.

In the present description, "pulsed light" refers to light having a short photo irradiation period (irradiation time), that is, in a case of repeating irradiation of pulsed light for plural times, as shown in FIG. 2, the photo irradiation includes a period during which the light is not irradiated (irradiation interval (off)) between a first photo irradiation period (on) and a second photo irradiation period (on). In FIG. 2, although photo intensity of the pulsed light is shown as being constant, the photo intensity can change within one photo irradiation period (on). The pulsed light is irradiated from a light source provided with a flash lamp such as a xenon flash lamp. The pulsed light is irradiated onto the layer of the ink composite by using such a light source. In a case of repeating n times of irradiations, one cycle (on+off) in FIG. 2 is repeated n times. Note that, in the case of repeatedly irradiating, it is preferable to perform cooling from a substrate side so that the substrate can be cooled to substantially a room temperature upon performing a subsequent pulse photo irradiation.

One irradiation period (on) of the pulsed light has a range of 5 microseconds to 1 second, and more preferably of 20 microseconds to 10 milliseconds. The sintering will not progress if the period is shorter than 5 microseconds, so an effect of improving property of the conductive layer (improving conductivity) becomes low. Further, if the period is longer than 1 second, an undesired influence due to photo degradation and heat deterioration becomes greater. Although the irradiation of the pulsed light can achieve the effects with a single irradiation, the irradiation can be repeated as described above. In the case of repeatedly irradiating, the irradiation interval (off) may have a range of 20 microseconds to 5 seconds, and more preferably of 2000 microseconds to 2 seconds. If the period is shorter than 20 microseconds, the light becomes close to the continuous light and is irradiated again with hardly any interval to be cooled after the previous irradiation, so there is a possibility that the substrate is heated, whereby a temperature thereof is increased and deterioration occurs. Further, if the period is longer than 5 seconds, although the effects to some degree can be achieved because the cooling progresses in the meantime, the effect of repetitive irradiation is reduced. Note that, the light source that operates at or more than 0.2 Hz can be used for the irradiation of the pulsed light. Further, electromagnetic waves having a wavelength range of 1 pm to 1 m can be used as the pulsed light. As an example of such electromagnetic waves, gamma ray, X-ray, ultraviolet ray, visible light, infrared ray and the like can be exemplified. Note that, in considering the conversion to thermal energy, too short wavelengths will cause larger damage to the ink layer itself, and too long wavelengths will not have an efficient absorption property which makes heat generation difficult. Accordingly, as the range of the wavelength, among the aforementioned wavelengths, especially the wavelength range of 10 nm to 1000 μm that is from far ultraviolet to far infrared is preferable, and the wavelength range of 200 nm to 3000 nm is more preferable.

Further, as the functional thin film 14, a film formed by sputtering targeting silicon, germanium, tin, lead, arsenic, antimony, bismuth, gallium, indium, tallium, zinc, cadmium, selenium, tellurium, and oxides and complex oxides thereof can be used.

By sintering the thin film itself formed by the sputtering, at least a part of the amorphous thin film can be crystallized; and by applying it as a semiconductor material for example for a field effect transistor, a field effect transistor having an improved charge mobility can be manufactured.

In the case of manufacturing the substrate film of the present embodiment, the resin material that will be a raw material for the coating layer 12 is applied at the thickness of 0.1 to 10 μm on the surface of the base film 10 by the roll coating, bar coating, spray coating, dip coating, drop coating, die coating, spin coating and the like, to form the coating layer 12 on the base film 10. The ink composite is printed on the surface of the coating layer 12 of the substrate film produced according to the above by using an appropriate printing method, to form the functional thin film 14. Next, the formed functional thin film 14 is sintered by the photo irradiation, to form the conductive layer (functional thin layer). At this occasion, since the coating layer 12 has the thermal resistance, the base film 10 can be protected from the heat generated as a result of internal heat generation caused by the photo irradiation in the conductive particles, so the generation of wrinkling or the occurrence of melting in the base film 10 can be avoided.

EXAMPLES

Hereinbelow, Examples of the present invention will specifically be explained. Note that, the following Examples are provided for the sake of easy understanding of the present invention, and the present invention is not to be limited to these Examples.

Reference Example 1

Preparation of Coating Solution for Coating Layer (Heat Resistant Layer)

Coating solution was prepared by mixing 40 parts of KAYARAD UX-5000 (pentafunctional urethane acrylate, manufactured by NIPPON KAYAKU Co., Ltd.), 60 parts of KAYARAD DPHA (mixture of dipentaerythritol pentaacrylate and dipentaerythritol hexaacrylate, manufactured by NIPPON KAYAKU Co., Ltd.), and 2 parts of Irgacure184 (1-hydroxy-cyclohexyl-phenyl-ketone, manufactured by Ciba Japan Co., Ltd.).

Further, aside from the above, 40 parts of KAYARAD UX-5000 (manufactured by NIPPON KAYAKU Co., Ltd.), 60 parts of KAYARAD DPHA (manufactured by NIPPON KAYAKU Co., Ltd.), and 0.02 parts of AIBN (azoisobutyronitrile) were mixed, and cured between two glass plates at 40° C. for 1 hr, 60° C. for 3 hrs, and 120° C. for 1 hr. The glass transition temperature of this cured resin was confirmed to be 259° C.

Reference Example 2

Coating solution was prepared by mixing 10 parts of 3',4'-epoxycyclohexylmethyl 3,4-epoxycyclohexane carboxylate (CELLOXIDE 2021P, manufactured by Daicel Corporation), and 0.2 parts of CPI-100P (photo-cationic curing agent, manufactured by SAN-APRO Ltd.).

Further, aside from the above, 10 parts of CELLOXIDE 2021P, and 0.2 parts of San-Aid SI-100L (thermal cationic curing agent, manufactured by Sanshin Chemical Industry Co., Ltd.) were mixed, and cured between two glass plates at 100° C. for 1 hr, 120° C. for 3 hrs, 160° C. for 1 hr. The glass transition temperature of this cured resin was confirmed to be 178° C.

Reference Example 3

Coating solution was prepared by mixing 7 parts of Ripoxy VR-77 (vinylester resin, manufactured by Showa Denko K.K.), 2 parts of cyclohexyl methacrylate, 1 part of KAYARAD DPHA (mixture of dipentaerythritol pentaacrylate and dipentaerythritol hexaacrylate, manufactured by NIPPON KAYAKU Co., Ltd.), 20 parts of methyl ethyl ketone, and 0.2 parts of Irgacure 184 (1-hydroxy-cyclohexyl-phenyl-ketone, manufactured by Ciba Japan Co., Ltd.).

Further, aside from the above, 7 parts of Ripoxy VR-77 (vinylester resin, manufactured by Showa Denko K.K.), 2 parts of cyclohexyl methacrylate, 1 part of KAYARAD DPHA (mixture of dipentaerythritol pentaacrylate and dipentaerythritol hexaacrylate, manufactured by NIPPON KAYAKU Co., Ltd.), and 0.1 g of dicumyl peroxide were mixed, and cured between two glass plates at 120° C. for 1 hr, 140° C. for 3 hrs, and 160° C. for 1 hr. The glass transition temperature of this cured resin was confirmed to be 148° C.

Reference Example 4

Coating solution was prepared by dissolving 10 parts of ACRYPET VH (polymethylmethacrylate, manufactured by Mitsubishi Rayon Co., Ltd.) in 50 parts of methyl ethyl ketone.

Further, aside from the above, a glass transition temperature of ACRYPET VH was measured, and was confirmed to be 106° C.

The glass transition temperature was measured under the following conditions.
<Glass Transition Temperature (Tg)>

The measurement was performed by a thermomechaical analysis (TMA). A thermomechanical analyser TMA/SS6100 manufactured by SII Nano Technology Inc. was used to perform measurement of a sample of 9×9×3 mm under the conditions that the temperature ranges from −10 to 300° C., the rate of temperature rise is 5° C./min, and the load is 20.0 mN. In the obtained expansion curve showing temperature transition, the temperature at the intersection of two lines respectively extrapolated from linear regions located below and above the inflection point was determined as the glass transition temperature.

Reference Example 5

Binder solution of 40 mass % was prepared by dissolving polyvinylpyrrolidone (manufactured by NIPPON SHOKUBAI CO., LTD.) as a binder in mixed aqueous solution of ethylene glycol and glycerin (reagent grade manufactured by KANTO CHEMICAL CO., INC.) (mass ratio of ethylene glycol:glycerin:water=70:15:15) as a reducing agent. 1.5 g of this binder solution and 0.5 g of the mixed aqueous solution were mixed, 6.0 g of NanoTek CuO (spherical shaped, D50=270 nm) manufactured by C. I. KASEI CO., LTD. was mixed therein as copper oxide particles, the resulting mixture was well mixed by a planetary centrifugal vacuum mixer "Thinky Mixer" ARV-310 (Awatori Rentaro) (manufactured by THINKY CORPORATION), and a paste for printing (composition for forming a conductive film) was produced thereby.

Note that, particle diameters of the particles were measured by Nanotrac UPA-EX150 (dynamic light scattering), the particle diameters were calculated by spherical approximation, and the median diameter D50 was obtained.

Example 1

The coating solution prepared in Reference Example 1 was coated on Lumirror 125U98 (polyethylene-terephthalate film manufactured by TORAY INDUSTRIES, INC.) that is a base film, irradiation of 100 mj/cm$^2$ by a high-pressure mercury UV lamp was performed thereto for curing, and thereby, a heat resistant layer having a thickness of 5 μm was formed. The paste obtained in Reference Example 5 was used to screen print a pattern of 2 cm×2 cm square on this heat resistant layer. Pulsed photo irradiation was performed on a paste-printed surface side of the obtained sample by using Sinteron3300 manufactured by Xenon corporation. The irradiation conditions were single irradiation with pulse width of 2000 microseconds, voltage of 3000V, and irradiation distance of 20 cm. Pulse energy upon that occasion was 2070 J. Thickness of a conductive film formed in accordance with the above was 25 μm. Note that, the series of the above procedures were carried out under air atmosphere.

It had been confirmed that the volume resistivity of the obtained film was $8.7 \times 10^{-5}$ Ω·cm, and that transition to the conductive film was performed by photo-sintering.

Figure 4:
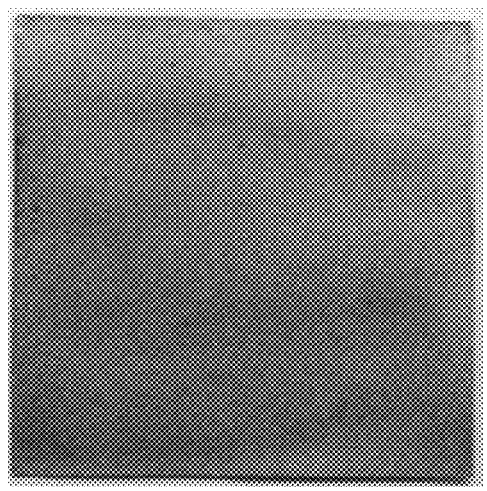
FIG. 4 is a picture showing a pattern forming surface after photo irradiation in Example 1.

FIG. 4 shows a picture of the pattern forming surface after the photo irradiation. In FIG. 4, portions with wrinkling and melting were not generated in the base film, and no damage caused by the photo irradiation was recognized in the base film.

Example 2

The coating solution prepared in Reference Example 2 was used, but aside from the aforementioned, similar operations as those of Example 1 were performed. The obtained conductive film had a thickness of 22 μm, and a volume resistivity of $9.6 \times 10^{-5}$ Ω·cm.

Example 3

The coating solution prepared in Reference Example 3 was used, and COSMO SHINE A4300 (polyethylene terephthalate film, manufactured by Toyobo Co., Ltd.) was used as a base film, but aside from the aforementioned, similar operations as those of the Example 1 were performed. The obtained conductive film had a thickness of 23 µm, and a volume resistivity of $4.2 \times 10^{-5}$ Ω·cm.

Comparative Example 1

The coating layer was not formed on Lumirror 125U98 (polyethylene terephthalate film manufactured by TORAY INDUSTRIES, INC.), and the paste obtained in the Reference Example 2 was directly screen printed on Lumirror 125U98, but aside from the aforementioned, similar operations as those of the Example 1 were performed.

Figure 5:
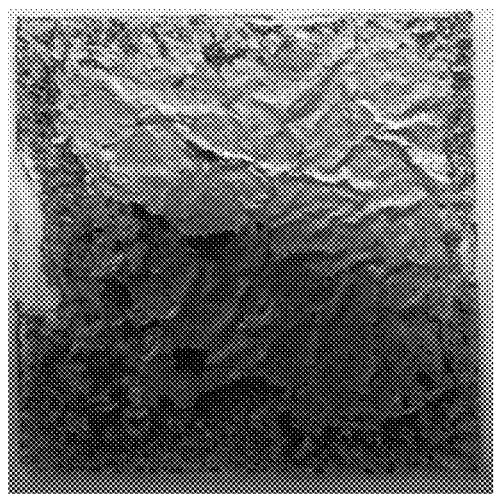
FIG. 5 is a picture showing a pattern forming surface after photo irradiation in Comparative Example 1.

FIG. 5 shows a picture of the pattern forming surface after the photo irradiation in the same manner as Example 1. In FIG. 5, a part of the printed pattern was blown up, and a part of the base film (PET film) had melted.

Comparative Example 2

The coating solution prepared in Reference Example 4 was used, but aside from the aforementioned, similar operations as those of Example 1 were performed. As a result, a part of the printed pattern was blown up, and a part of the base film (PET film) had melted.

Example 4

Similar to Example 1, the coating solution prepared in Reference Example 1 was coated on Lumirror 125U98 (polyethylene-terephthalate film manufactured by TORAY INDUSTRIES INC.) that is the base film, irradiation of 100 mj/cm² by the high-pressure mercury UV lamp was performed thereto for curing, and thereby, the heat resistant layer having a thickness of 5 µm was formed. Silicon was deposited by sputtering on this heat resistant layer so as to have a thickness of 200 nm.

Single photo irradiation was performed on a silicon-deposited surface side of the obtained sample by using PulseForge3300 manufactured by Novacentrix Corporation with a voltage of 350V and a pulse width of 2000 microseconds.

Figure 3:
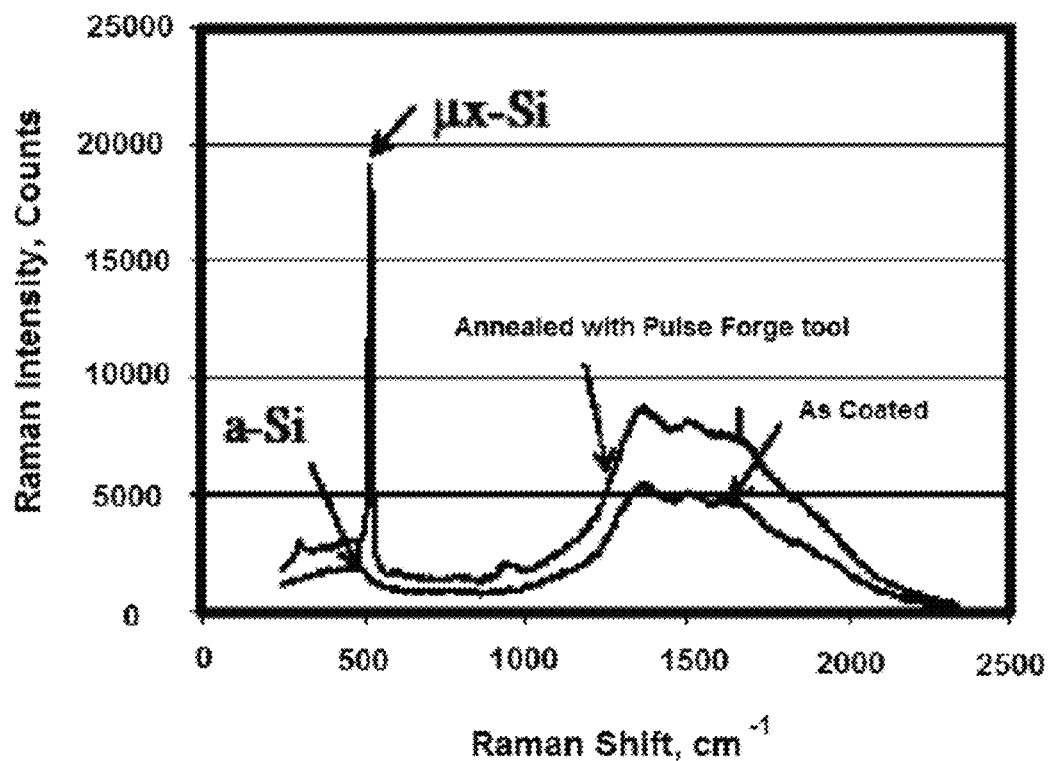
FIG. 3 is a Raman spectrum showing that a change in a crystal structure of silicon has occurred by photo irradiation in Example 2.

As a result of having measured Raman spectrum of the silicon film of the obtained sample (FIG. 3), a peak was observed at 500 cm$^{-1}$. Due to this, it has been discovered that the amorphous silicon film formed by deposition had been transferred to a microcrystal silicon film by having performed the photo irradiation thereon. No abnormality caused by the photo irradiation was found in the base film (Lumirror 125U98).

Comparative Example 3

Other than having deposited silicon without forming the coating layer on Lumirror 125U98 (polyethylene-terephthalate film manufactured by TORAY INDUSTRIES INC.), similar operations as those of Example 4 were performed.

Although a peak was observed at 500 cm$^{-1}$ in the Raman spectrum, similar to Example 4, deformation caused by heat upon the photo irradiation occurred in the base film (Lumirror 125U98).

REFERENCE SIGNS LIST

10 base film, 12 coating layer, 14 functional thin film

The invention claimed is:

1. A substrate film for photo irradiation, comprising
  a base film, and
  a coating layer (heat resistant layer) formed on the base film,
  wherein the coating layer is formed of a heat resistant resin having a higher Tg than the base film, has a Tg of higher than 200° C., has a surface configured to receive a functional thin film sintered by photo irradiation, and has a thickness of 0.1 to 10 µm.

2. The substrate film according to claim 1, wherein the heat resistant resin that forms the coating layer is a cross-linked three-dimensional resin.

3. The substrate film according to claim 1, wherein the heat resistant resin that forms the coating layer contains 5 to 80 mass % of at least one filler selected from the group consisting of silica, alumina, titania and zirconia, the filler having 500 nm or less average particle diameter d50 measured by dynamic light scattering.

4. The substrate film according to claim 1, wherein the base film is a polyethylene terephthalate film, polyethylene naphthalate film, polycarbonate film, polyacrylate film, polyolefin film, polycycloolefin film, or polyimide film, or paper.

5. The substrate film according to claim 1, wherein the base film has a thickness of 10 µm to 3 mm.

6. A substrate comprising
  a base film,
  a coating layer (heat resistant layer) formed on the base film,
  wherein the coating layer is formed of a heat resistant resin having a higher Tg than the base film and has a thickness of 0.1 to 10 µm, and
  a functional thin layer (pattern) sintered by photo irradiation on the coating layer.

7. The substrate according to claim 6, wherein the functional thin layer comprises at least one selected from the group consisting of gold, silver, copper, aluminum, nickel, cobalt, oxides thereof, graphite, graphene, carbon nanotube, zinc oxide, tin oxide, indium tin oxide, and polysilane.

8. The substrate according to claim 6, wherein the functional thin layer is formed by any one selected from the group consisting of silicon, germanium, tin, lead, arsenic, antimony, bismuth, gallium, indium, thallium, zinc, cadmium, selenium, tellurium, and oxides or complex oxides thereof.

9. A sintering method comprising
  preparing a substrate film having a base film and a coating layer (heat resistant layer) formed on the base film, wherein the coating layer is formed of a heat resistant resin having a higher Tg than the base film,
  forming a functional thin film on the surface of the coating layer, and
  sintering the functional thin film by photo irradiation.

10. The sintering method according to claim 9, wherein the light to be irradiated is pulsed light having a wavelength of 200 to 3000 nm.

11. The sintering method according to claim 9, wherein the functional thin film is produced by printing an ink composite containing at least one selected from the group consisting of gold, silver, copper, aluminum, nickel, cobalt, oxides thereof, graphite, graphene, carbon nanotube, zinc oxide, tin oxide, indium tin oxide, and polysilane.

12. The sintering method according to claim 9, wherein the functional thin film is formed by sputtering targeting silicon, germanium, tin, lead, arsenic, antimony, bismuth, gallium, indium, tallium, zinc, cadmium, selenium, tellurium, and oxides and complex oxides thereof.

13. The substrate according to claim 6, wherein the heat resistant resin has a Tg (glass transition temperature) of 120° C. or more.

14. The substrate according to claim 6, wherein the heat resistant resin that forms the coating layer is a crosslinked three-dimensional resin.

15. The substrate according to claim 2, wherein the heat resistant resin that forms the coating layer has a Tg of higher than 200° C.

16. The substrate according to claim 6, wherein the heat resistant resin that forms the coating layer contains 5 to 80 mass % of at least one filler selected from the group consisting of silica, alumina, titania and zirconia, the filler having 500 nm or less average particle diameter d50 measured by dynamic light scattering.

17. The substrate according to claim 6, wherein the base film is a polyethylene terephthalate film, polyethylene naphthalate film, polycarbonate film, polyacrylate film, polyolefin film, polycycloolefin film, or polyimide film, or paper.

18. The substrate according to claim 6, wherein the base film has a thickness of 10 μm to 3 mm.

19. The sintering method according to claim 9, wherein the heat resistant resin has a Tg (glass transition temperature) of 120° C. or more.

20. The sintering method according to claim 9, wherein the heat resistant resin that forms the coating layer is a crosslinked three-dimensional resin.

21. The sintering method according to claim 9, wherein the heat resistant resin that forms the coating layer has a Tg of higher than 200° C.

22. The sintering method according to claim 9, wherein the heat resistant resin that forms the coating layer contains 5 to 80 mass % of at least one filler selected from the group consisting of silica, alumina, titania and zirconia, the filler having 500 nm or less average particle diameter d50 measured by dynamic light scattering.

23. The sintering method according to claim 9, wherein the base film is a polyethylene terephthalate film, polyethylene naphthalate film, polycarbonate film, polyacrylate film, polyolefin film, polycycloolefin film, or polyimide film, or paper.

24. The sintering method according to claim 9, wherein the coating layer has a thickness of 0.1 to 10 μm.

25. The sintering method according to claim 9, wherein the base film has a thickness of 10 μm to 3 mm.

* * * * *